US012456625B2

(12) United States Patent
Zhang

(10) Patent No.: US 12,456,625 B2
(45) Date of Patent: Oct. 28, 2025

(54) PLANARIZATION METHOD OF WAFER

(71) Applicant: NANYA TECHNOLOGY CORPORATION, New Taipei (TW)

(72) Inventor: Kai Zhang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 210 days.

(21) Appl. No.: 18/536,326

(22) Filed: Dec. 12, 2023

(65) Prior Publication Data

US 2025/0191925 A1    Jun. 12, 2025

(51) Int. Cl.
*H01L 21/304* (2006.01)
*B24B 37/04* (2012.01)
*B24B 37/20* (2012.01)
*H01L 21/306* (2006.01)
*H01L 21/683* (2006.01)

(52) U.S. Cl.
CPC .......... *H01L 21/304* (2013.01); *B24B 37/042* (2013.01); *B24B 37/20* (2013.01); *H01L 21/30604* (2013.01); *H01L 21/30625* (2013.01); *H01L 21/6835* (2013.01); *H01L 2221/68327* (2013.01)

(58) Field of Classification Search
CPC ....................................................... B24B 37/20
See application file for complete search history.

(56) References Cited

U.S. PATENT DOCUMENTS

| | | | | |
|---|---|---|---|---|
| 5,942,449 A | * | 8/1999 | Meikle | H01L 21/3212 257/E21.309 |
| 2012/0252212 A1 | * | 10/2012 | Nishida | H01L 21/30604 438/691 |
| 2014/0329381 A1 | * | 11/2014 | Zhang | H01L 24/13 438/613 |
| 2020/0335379 A1 | * | 10/2020 | Bayless | H01L 21/30625 |
| 2020/0365413 A1 | * | 11/2020 | Nien | H01L 21/7684 |
| 2023/0352438 A1 | * | 11/2023 | Wu | H01L 24/08 |

* cited by examiner

*Primary Examiner* — Binh X Tran
(74) *Attorney, Agent, or Firm* — CKC & Partners Co., LLC

(57) ABSTRACT

Embodiments of this disclosure provide a planarization method of a wafer, and the method includes the following steps. A wafer with a semiconductor structure on a front surface of the wafer is provided. A protection layer is formed on the semiconductor structure of the wafer. A pattern mask is formed on a back surface of the wafer to cover a first portion of the back surface and expose a second portion and a third portion of the back surface. Also, the pattern mask is a symmetrical shape. The second portion and the third portion of the wafer are etched to form a symmetrical pattern in a backside of the wafer. A planarization process is performed to remove the protection layer on the front surface of the wafer.

20 Claims, 9 Drawing Sheets

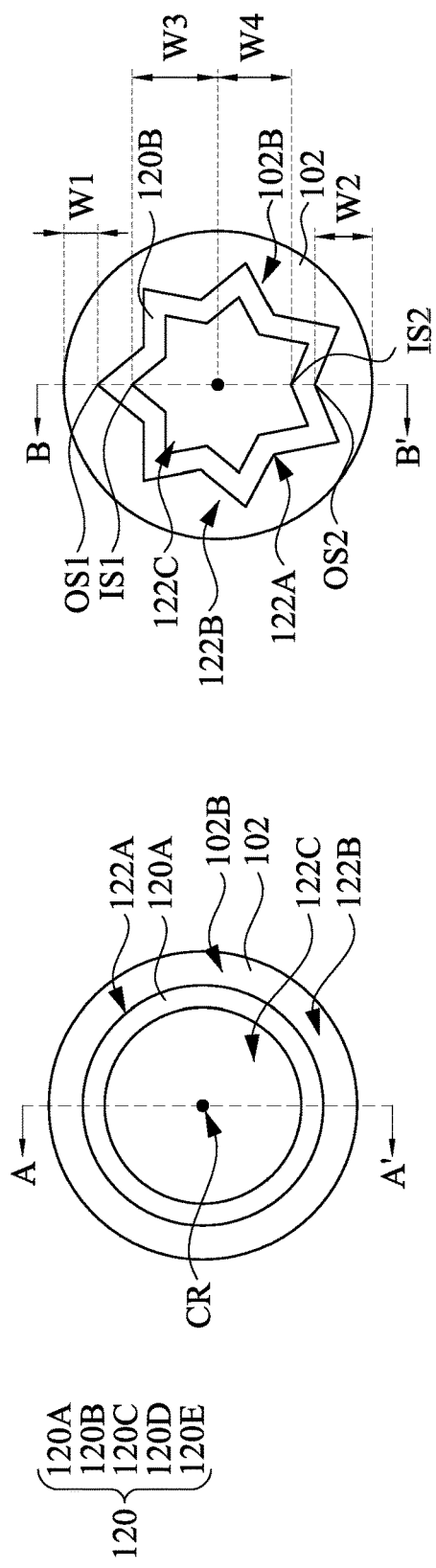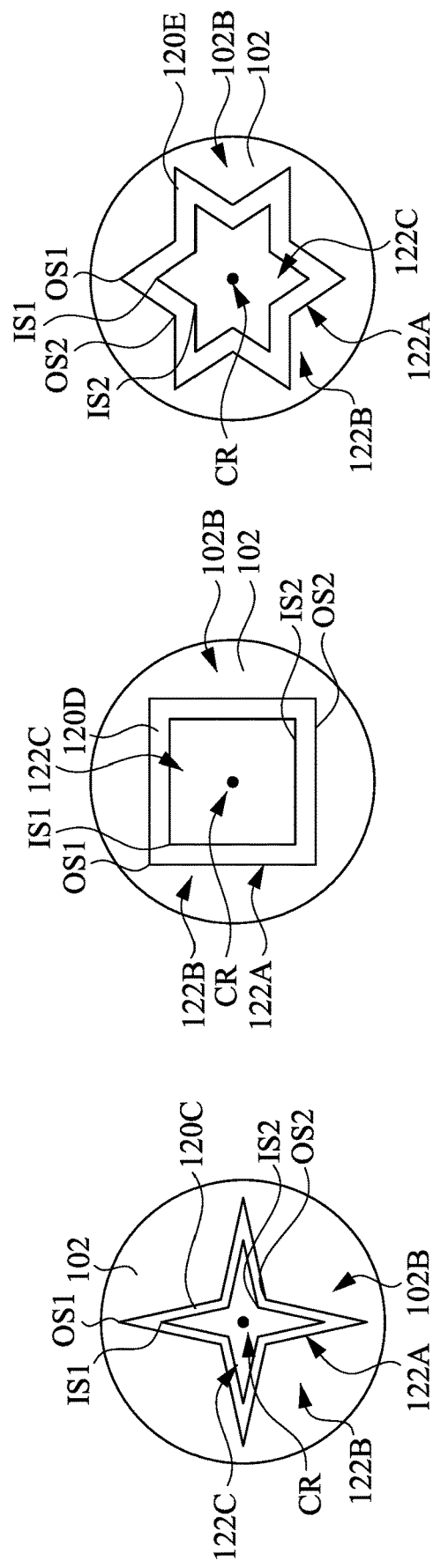

PLANARIZATION METHOD OF WAFER

BACKGROUND

Field of Invention

The present disclosure relates to a planarization method of a wafer. More particularly, the present disclosure relates to a planarization method of a wafer for improving the planarity.

Description of Related Art

Processes of manufacturing semiconductor wafers involve many operations. For example, forming various layers (such as insulation layers, conductive layers, etc.), performing a lithography process, etching the layers, stripping the layer and like. The operations are performed repeatedly to form various functional layers over the semiconductor wafers.

However, the stacking operations of the semiconductor wafers usually suffered from a rough surface due the incomplete planarization of the layers. Repeating the operations on the incomplete planarization of the layers, the quality of the semiconductor wafers is affect.

SUMMARY

Embodiments of this disclosure provide a planarization method of a wafer, and the method includes the following steps. A wafer with a semiconductor structure on a front surface of the wafer is provided. A protection layer is formed on the semiconductor structure of the wafer. A pattern mask is formed on a back surface of the wafer to cover a first portion of the back surface and expose a second portion and a third portion of the back surface. Also, the pattern mask is a symmetrical shape. The second portion and the third portion of the wafer are etched to form a symmetrical pattern in a backside of the wafer. A planarization process is performed to remove the protection layer on the front surface of the wafer and the symmetrical pattern in the backside of the wafer, and the planarization process includes the following steps. The wafer is mounted on a polishing machine with a grind pad through sucking the symmetrical pattern in the backside of the wafer, and the protection layer on the semiconductor structure is removed.

In some embodiments, the planarization process includes that wafer is mounted on the polishing machine with the grind pad through sucking a surface of the semiconductor structure after removing the protection layer, and the backside of the wafer is planarized.

In some embodiments, performing the planarization process includes that the wafer is pressed against a surface of the grind pad and rotating the wafer. A slurry is provided on the surface of the grind pad.

In some embodiments, etching the second portion and the third portion of the wafer is performed through a wet etching process.

In some embodiments, the wet etching process includes that the wafer with the pattern mask is put in an etching tank with an etchant, and the second portion and the third portion are removed through the wet etching process.

In some embodiments, the etchant includes $HNO_3{}_{(aq)}$, $H_2SO_4{}_{(aq)}$, $HF_{(aq)}$ or combinations thereof.

In some embodiments, the protection layer formed on the semiconductor structure is resistant to the etchant.

In some embodiments, a portion of the wafer originally containing the symmetrical pattern and portions recessed after etching are coplanar after the planarization process.

In some embodiments, the pattern mask has a hollow and symmetrical pattern.

In some embodiments, an outer distance between an outer edge of the symmetrical pattern and an outer edge of the wafer is the same or different.

In some embodiments, the second portion is a portion from an edge of the wafer to an outer edge of the pattern mask, and the third portion is an exposed portion near to a center of the wafer.

Embodiments of this disclosure provide a planarization method of a wafer, and the method includes the following steps. A wafer with a semiconductor structure on a front surface of the wafer is provided. An oxide layer is formed on the semiconductor structure of the wafer. A pattern mask is formed on a back surface of the wafer to cover a portion of the back surface and expose an outward exposed portion and an inward exposed portion of the back surface. Also, the pattern mask is a symmetrical shape. The outward exposed portion and the inward exposed portion of the wafer are etched to form a symmetrical pattern in a backside of the wafer. A planarization process is performed to remove the protection layer on the front surface of the wafer and the symmetrical pattern in the backside of the wafer, wherein performing the planarization process includes the following steps. The wafer is placed in a wafer-holding hole of a polishing machine. The wafer is clamped by a lower fixing plate and an upper fixing plate. The lower fixing plate includes a lower grind pad on an upper surface of the lower fixing plate, and the upper fixing plate includes an upper grind pad on a lower surface of the upper fixing plate. The lower fixing plate and the upper fixing plate are rotated to remove the protection layer on the front surface of the wafer and the symmetrical pattern in the backside of the wafer.

In some embodiments, etching the outward exposed portion and the inward exposed portion is performed through a wet etching process.

In some embodiments, the wet etching process includes that the wafer with the pattern mask is put in an etching tank with an etchant.

In some embodiments, an etching rate of the wet etching process is controlled by adjusting bubble positions, bubble flows, a rotate acceleration, a temperature of the etching tank, an acid content in the etchant, a pressure of the wet etching process or combinations thereof.

In some embodiments, the oxide layer formed on the semiconductor structure is resistant to the etchant to protect the semiconductor structure and the wafer from etching damage.

In some embodiments, a surface of the oxide layer contacts a surface of the upper grind pad, and the symmetrical pattern contacts a surface of the lower grind pad.

In some embodiments, a surface of the oxide layer contacts a surface of the lower grind pad, and the symmetrical pattern contacts a surface of the upper grind pad.

In some embodiments, a slurry is applied to a surface of the lower grind pad and a surface of the upper grind pad during the planarization process.

In some embodiments, an outer distance between an outer edge of the symmetrical pattern and an outer edge of the wafer is the same or different.

In some embodiments, when four sides of the symmetrical pattern and a center of the wafer are on a same imaginary line, a distance between the side of an inner edge of the symmetrical pattern furthest from the center of the wafer and the center of the wafer is greater than a distance between the side of the inner edge of the symmetrical pattern nearest from the center of the wafer and the center of the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The disclosure can be more fully understood by reading the following detailed description of the embodiment, with reference made to the accompanying drawings as follows.

FIGS. 1-4B are views of a planarization method of a wafer in various operations according some embodiments of this disclosure.

DETAILED DESCRIPTION

Figure 1:
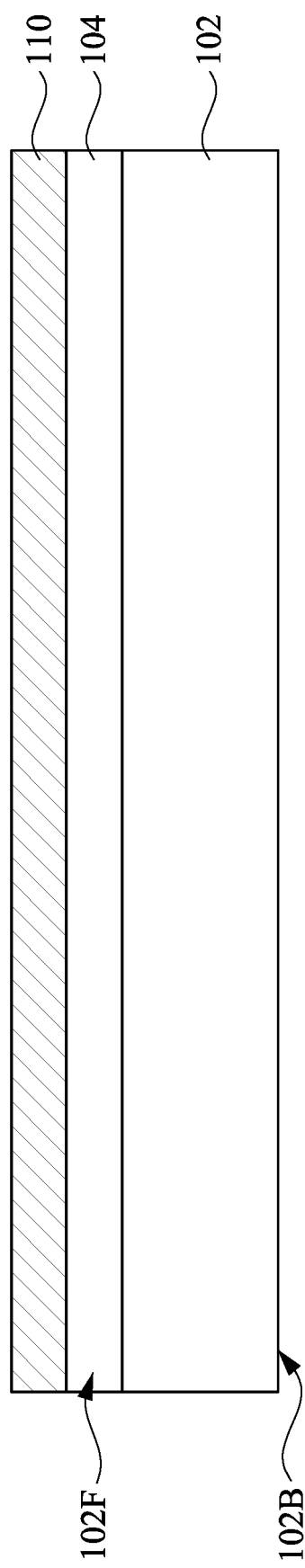

Reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "on," "over," "under," "between" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The words "comprise", "include", "have", "contain" and the like used in the present disclosure are open terms, meaning including but not limited to.

It should be noted that when the following figures, such as FIGS. 1 to 8, are illustrated and described as a series of operations or steps, the description order of these operations or steps should not be limited. For example, some operations or steps may be undertaken in a different order than in the present disclosure, or some operations or steps may occur currently, or some operations may not be used, and/or some operations or steps may be repeated. Moreover, the actual operations or steps of process stages may require additional operations or steps before, during or after planarizing a wafer. Therefore, the present disclosure may briefly illustrate some of these additional operations or steps. Further, unless otherwise stated, the same explanations discussed for the following figures, such as FIGS. 1 to 8, apply directly to the other figures.

Please refer to FIG. 1. FIG. 1 is a cross-section of a planarization method of a wafer during forming a protection layer over a wafer according to some embodiments of this disclosure. A wafer (also called a substrate) 102 is provided, and a semiconductor structure 104 is formed on a front surface 102F of the wafer 102. The semiconductor structure 104 refers to any structure that may be formed on the wafer 102, such as a structure after forming active areas and insulation areas, a structure after forming word line structure, a structure after forming landing pads or so on. In some embodiments, the wafer 102 is, for example, a silicon wafer, a gallium nitride wafer or a silicon carbide wafer. Then, a protection layer 110 is formed on the semiconductor structure 104. In some embodiments, the protection layer 110 is formed by a coating process. In some embodiments, a material of the protection layer 110 is oxide. The protection layer 110 is configured to prevent the semiconductor structure 104 and the front surface 102F of the wafer 102 from being etched during subsequent etching process.

Next, refer to FIGS. 2A to 2E. FIGS. 2A to 2E are top views of a planarization method of a wafer during forming a pattern mask on a protection layer according to some embodiments of this disclosure. A pattern mask (collectively called pattern mask 120), such as a pattern mask 120A, a pattern mask 120B, a pattern mask 120C, a pattern mask 120D or a pattern mask 120E, is formed on a back surface 102B of the wafer 102. As shown in FIGS. 2A to 2E, the pattern mask 120 is a symmetrical shape, such as circular, rectangular, star-shaped, regular polygon and like.

In some embodiments, the pattern mask 120 has a hollow and symmetrical pattern. A first portion 122A of the back surface 102B of the wafer 102 is covered by the pattern mask 120, and a second portion 122B and a third portion 112C of the back surface 102B of the wafer 102 is exposed after forming the pattern mask 120. In addition, the second portion 122B of the back surface of the wafer refers to a portion from an edge of the wafer 102 to an outer edge of the pattern mask 120, and the third portion 122C of the back surface 102B of the wafer 102 refers to an exposed portion near to a center CR of the wafer 102. In other words, based on a position of the pattern mask on the back surface 102B of the wafer 102, an outward exposed portion is the second portion 122B, and an inward exposed portion is the third portion 122C.

As shown in FIGS. 2A to 2E, a width between an outer edge of the first portion 122A of the wafer 102 and the outer edge of the pattern mask 120 is the same or different. In the embodiments with the different width between the outer edge of the first portion 122A of the wafer 102 and the outer edge of the pattern mask 120, a first width (for example, the first width W1 in FIG. 2B) between a first outer side OS1 of the pattern mask 120 furthest from the center CR of the wafer 102 and an edge of the wafer nearest to the first outer side OS1 is minimum, and a second width (for example, the second width W2 in FIG. 2B) between a second outer side OS2 of the pattern mask 120 and an edge of the wafer nearest to the second outer side OS2 is maximum.

Further, as shown in FIGS. 2A to 2E, a width an inner edge of the pattern mask and the center CR of the wafer is the same or different. In some embodiments, when four sides of the pattern mask are in an imaginary line passing through the center CR of the wafer, a third width (for example, the third width W3 in FIG. 2B) between a first inner mask side IS1 furthest from the center CR of the wafer 102 and the center CR of the wafer 102 is greater than a fourth width (for example, the fourth width W4 in FIG. 2B) between a second inner mask side IS2 nearest to the center CR of the wafer 102 and the center CR of the wafer 102.

Figure 3:
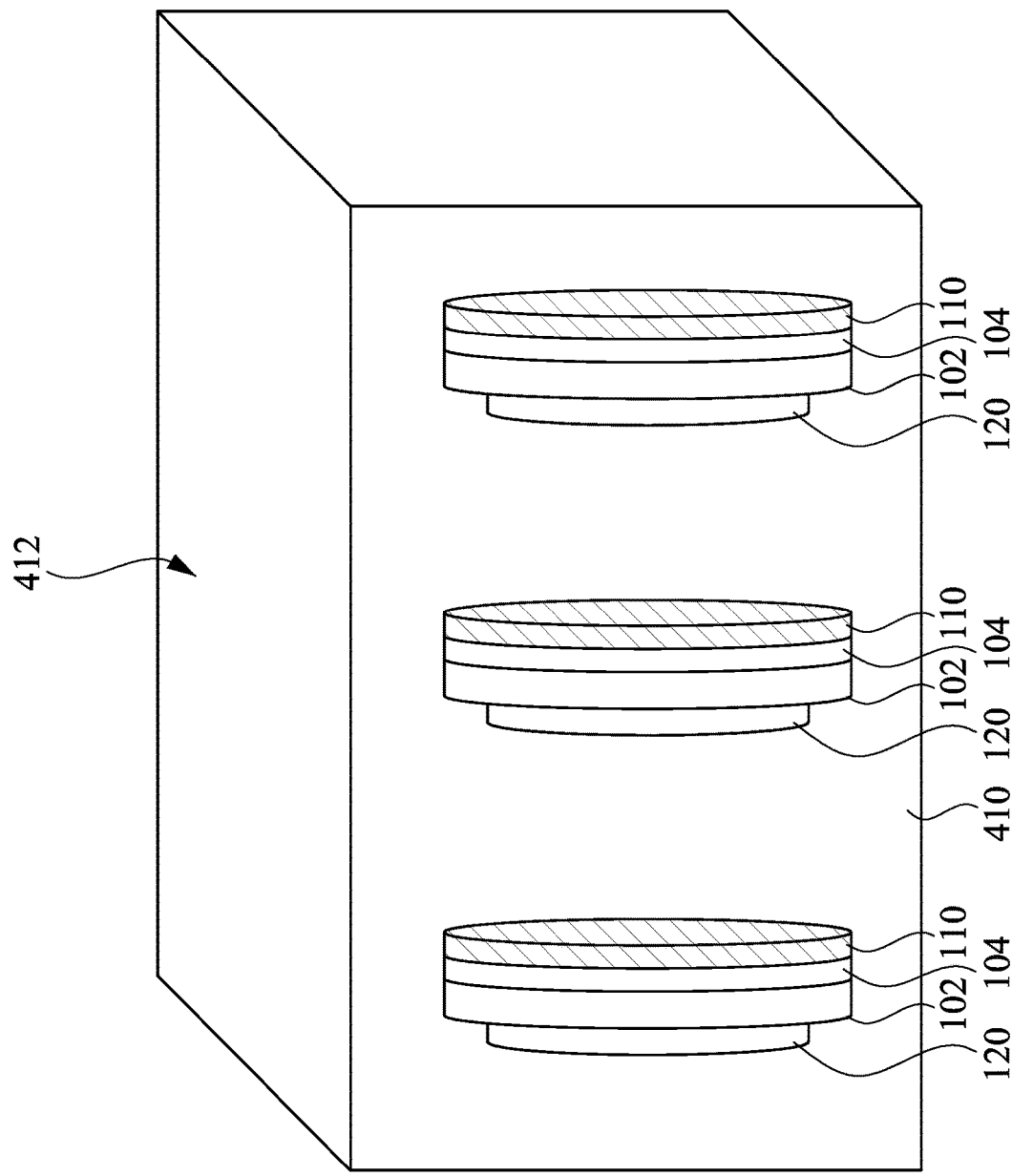

Next, refer to FIG. 3. FIG. 3 is a schematic diagram of a planarization method of a wafer during etching a wafer including a pattern mask according to some embodiments of this disclosure. The back surface 102B of wafer 102 is performed a photolithography process after forming the pattern mask 120. Then, the wafer 102 with the pattern mask 120 is etched to form a symmetrical pattern (for example, a symmetrical pattern 130A or 130B, collectively referred to as the symmetrical pattern 130) in the backside of the wafer 102. Specifically, the first portion (such as shown in FIGS. 2A to 2E, the first portion 122A) covered by the pattern mask 120 is remained without being etched, and the second portion (such as shown in FIGS. 2A to 2E, the second portion 122B) and the third portion (such as shown in FIGS. 2A to 2E, the third portion 122C) exposed by the pattern mask 120 are etched. In some embodiments, the wafer 102 with the pattern mask is etched by a wet etching process. In these embodiments, the wafer 102 with the pattern mask 120 is put in an etching tank 410 with an etchant 412. In some embodiments, the etchant 412 includes $HNO_{3\ (aq)}$, $H_2SO_{4\ (aq)}$, $HF_{(aq)}$ or combinations thereof. In some embodiment, an etching rate of the wet etching process is controlled by adjusting the etching conditions, such as bubble positions, bubble flows, a rotate acceleration, a temperature of the etching tank 410, an acid content, a process pressure and like. The pattern mask 120 is removed after etching. It is worth to mention that the protection layer 110 formed on the semiconductor structure is resistant to the etchant 412 to protect the semiconductor structure 104 and the wafer 102 from etching damage.

Figure 4A:
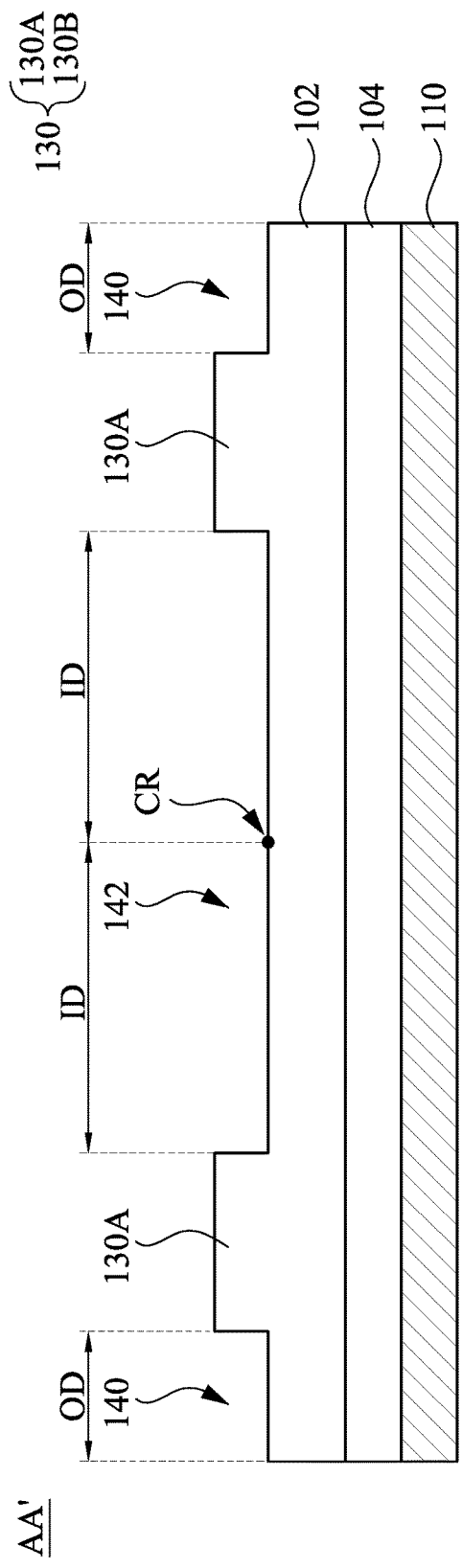
Figure 4B:
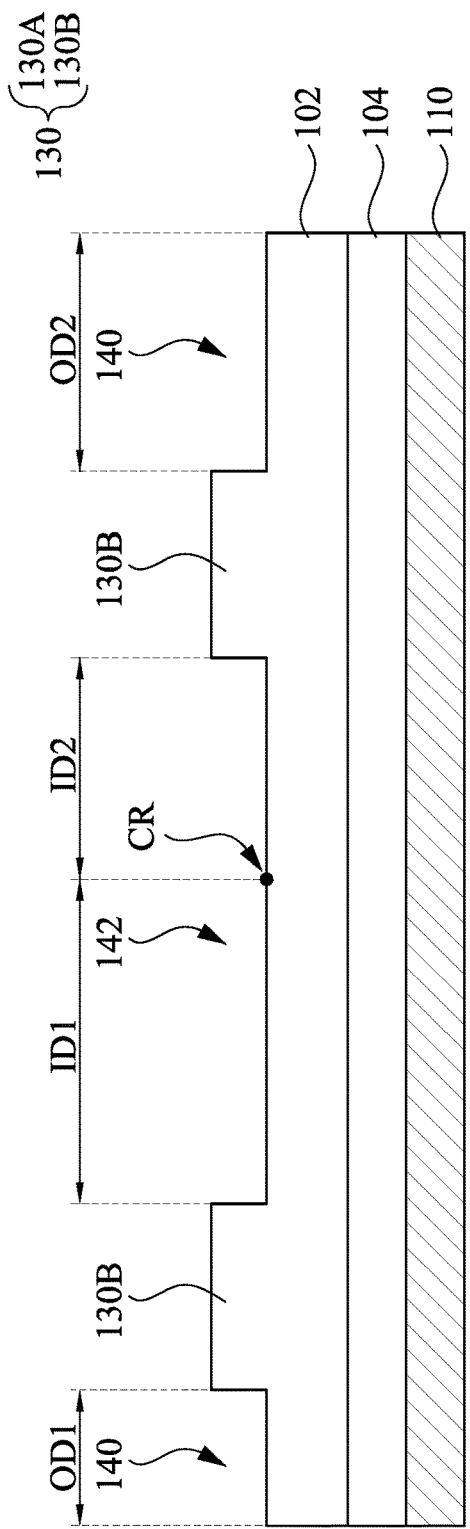

Then, please refer to FIGS. 4A and 4B. FIG. 4A is a sectional view of a planarization method of a wafer after etching illustrated based on a cross-section of AA' in FIG. 2A according to some embodiments of this disclosure, and FIG. 4B is a sectional view of a method of planarizing a wafer after etching illustrated based on a cross-section of BB' in FIG. 2B according to other embodiments of this disclosure. A symmetrical pattern 130 is formed in the backside of the wafer 102 after etching the backside of the wafer 102. Specifically, the second portion 122B and the third portion 122C of the backside of the wafer are removed to form an outer recess and an inner recess, respectively.

Based on the pattern mask (such as the pattern mask 120A, 120B, 120C, 120D or 120E), an outer distance between an outer side of the symmetrical pattern 130 and the edge of the wafer 102 is the same or different. For example, as shown in FIG. 4A, since the pattern mask 120A is circular, an outer distance OD in the outer recess 140 is the same. For another example, as shown in FIG. 4B, since the pattern mask 120B is regular polygon, the outer distance between the outer side of the symmetrical pattern 130 and the edge of the wafer 102 is different. Further, an outer distance OD1 between the outer side of symmetrical pattern 130 furthest from the center CR of the wafer 102 and the edge of the wafer 102 is less than an outer distance OD2 between the outer side of the symmetrical pattern 130 nearest to the center CR of the wafer 102 and the edge of the wafer 102.

As well, inner distances between an inner side of the symmetrical pattern 130 and the center CR of the wafer 102 are the same or different. For example, as shown in FIG. 4A, since the pattern mask 120A is circular, inner distances ID between the inner side of the symmetrical pattern 130A and the center CR of the wafer 102 in the inner recess 142 are the same. For another example, as shown in FIG. 4B, since the pattern mask 120B is regular polygon, inner distances between the inner side of the symmetrical pattern 130 and the center CR of the wafer 102 are different. Further, an inner distance ID1 between the inner side of symmetrical pattern 130 furthest from the center CR of the wafer 102 and the edge of the wafer 102 is greater than an inner distance ID2 between the inner side of the symmetrical pattern 130 nearest to the center CR of the wafer 102 and the edge of the wafer 102.

Figure 5:
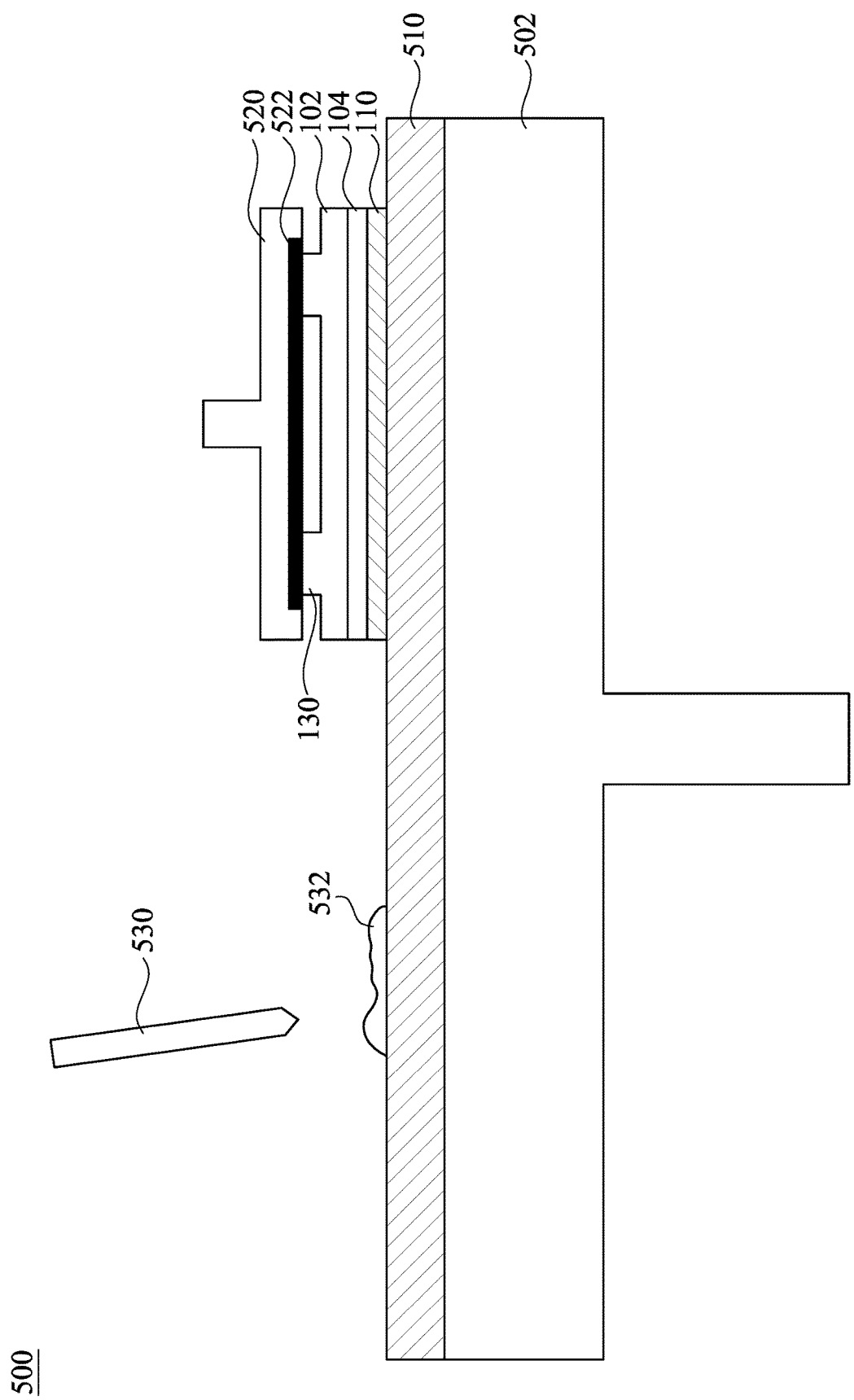
FIGS. 5-6 are views of a planarization method of a wafer during a planarization process according some embodiments of this disclosure.
Figure 6:
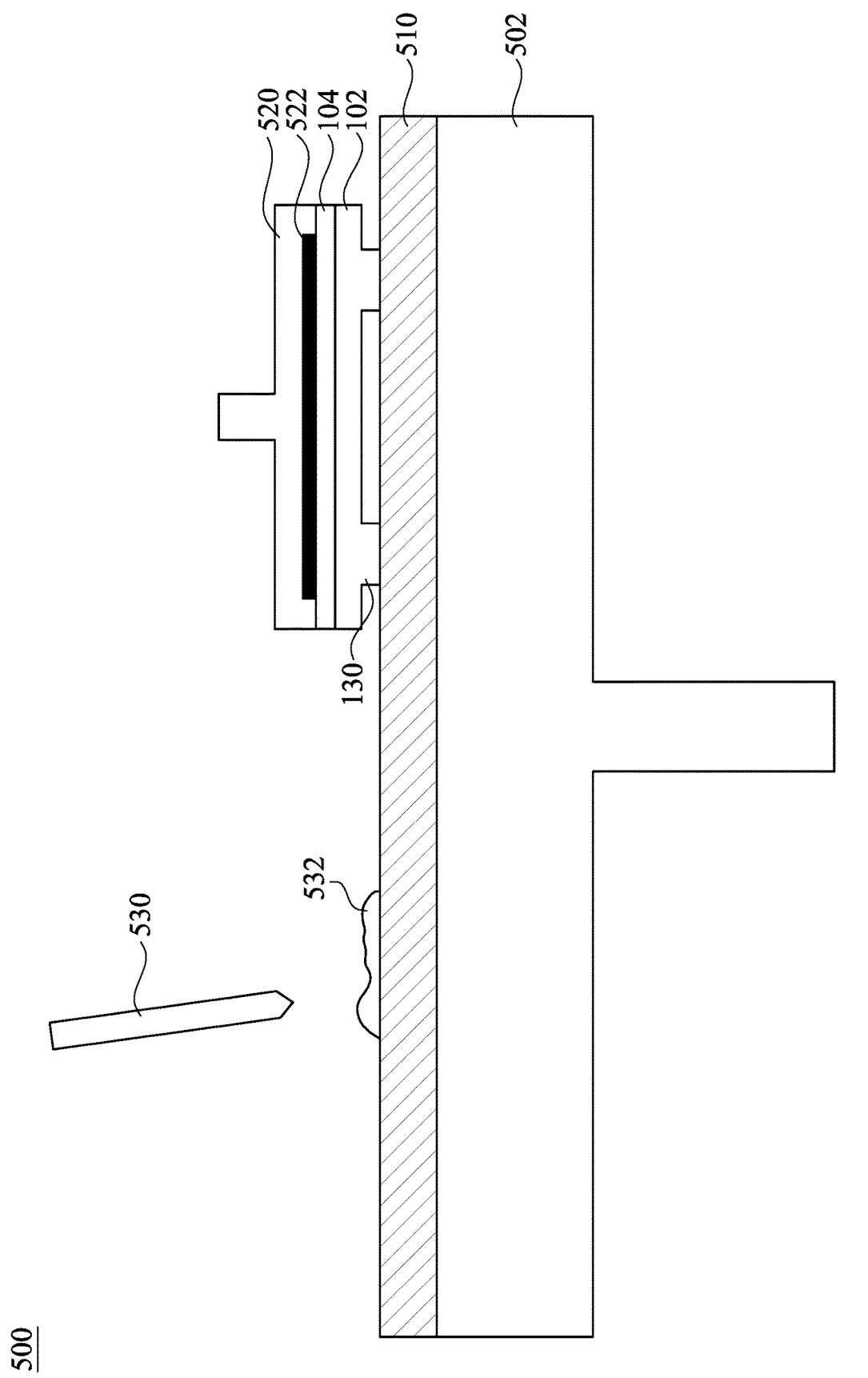

Further, please refer to FIGS. 5 and 6. FIGS. 5 and 6 are views of a planarization method of a wafer during a planarization process according some embodiments of this disclosure. In these operations, the protection layer 110 and the symmetrical pattern 130 are removed by a planarization process. In some embodiments, the planarization process is a single-side planarization process or a double-side planarization process.

In FIG. 6, the planarization process, such as a chemical mechanical planarization (CMP), is performed to remove the protection layer 110 on the wafer 102 by a polishing machine 500. The polishing machine 500 includes a supporting plate 502, a grind pad 510 on the supporting plate 502, a wafer carrier 520, a wafer chuck 522 in the wafer carrier 520, a slurry dispenser 530 and slurry 532 in the slurry dispenser 530.

Specifically, the wafer 102 is mounted on the wafer carrier 520 by the wafer chuck 522 through sucking the symmetrical pattern 130 in the backside of the wafer 102. Next, the wafer carrier 520 sucking with the wafer 102 is rotated as downward pressure to make the protection layer 110 against a surface of the grind pad 510, and the supporting plate 502 is also rotated. As well, the slurry 532 containing a reactive chemical is dispensed on the surface of the grind pad 510 during the planarization process. The slurry 532 reacts with the surface of the protection layer 110. The protection layer 110 over the wafer 102 is removed through a combination of both mechanical and chemical mechanisms.

Then, in FIG. 6, the symmetrical pattern 130 in the backside of the wafer 102 is removed by the planarization process, such as the chemical mechanical planarization, after removing the protection layer 110. Also, the wafer 102 is mounted on the wafer carrier 520 by the wafer chuck 522 through sucking a surface of the semiconductor structure 104 on the wafer 102. Subsequently, the symmetrical pattern 130 in the backside of the wafer 102 is removed through pressing and rotating the wafer 102 against the surface of the grind pad 510 with the slurry 532. The portion of the wafer 102 originally containing the symmetrical pattern 130 (such as the first portion 122A of the wafer 102 in FIGS. 2A-2E), the outer recess 140 and the inner recess 142 are coplanar after the planarization process. That is, the backside of the wafer 102 is planarized after the planarization process.

Figure 7:
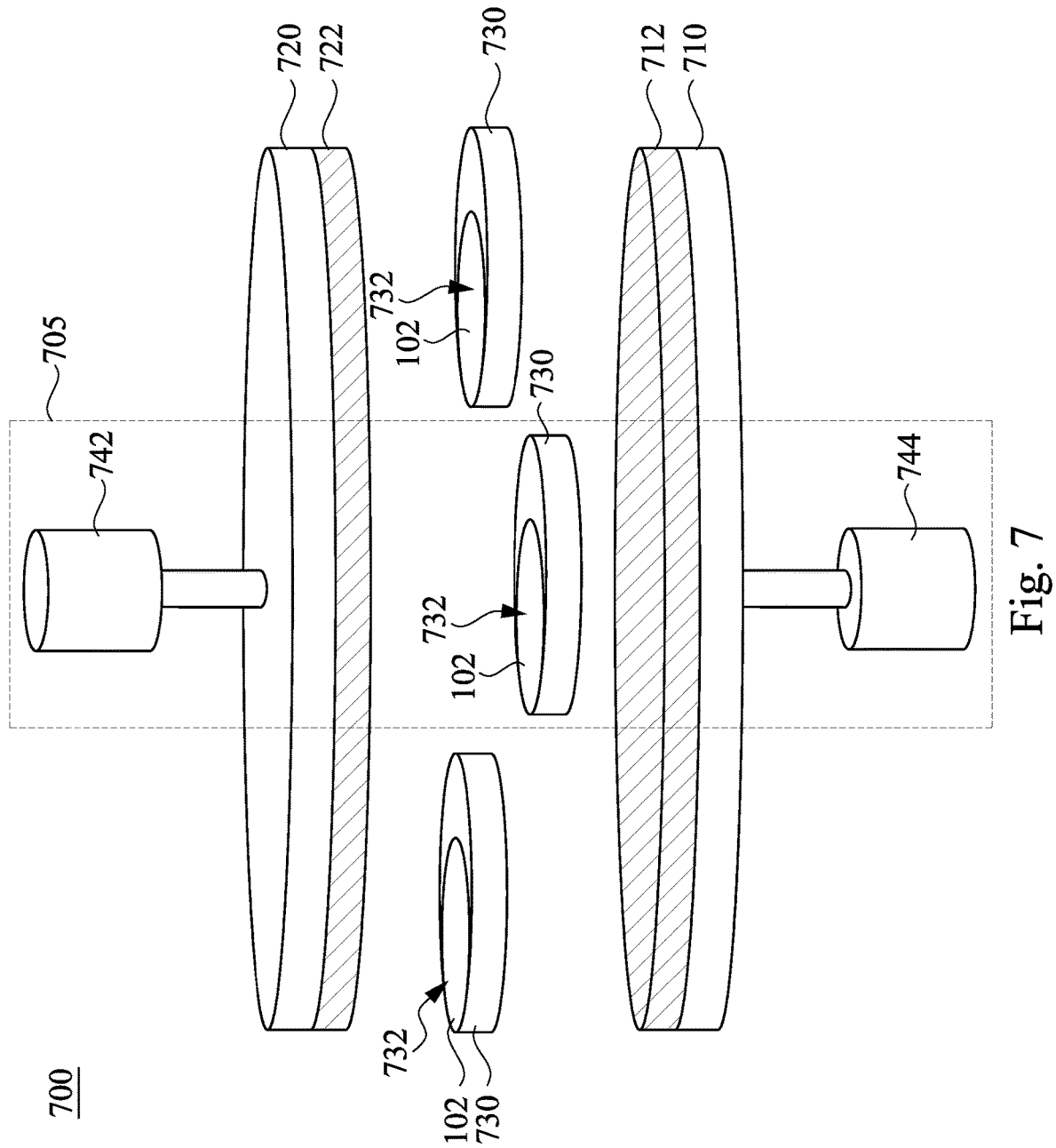
FIGS. 7-8 is views of a planarization method of a wafer with respect to another planarization process according some embodiments of this disclosure.
Figure 8:
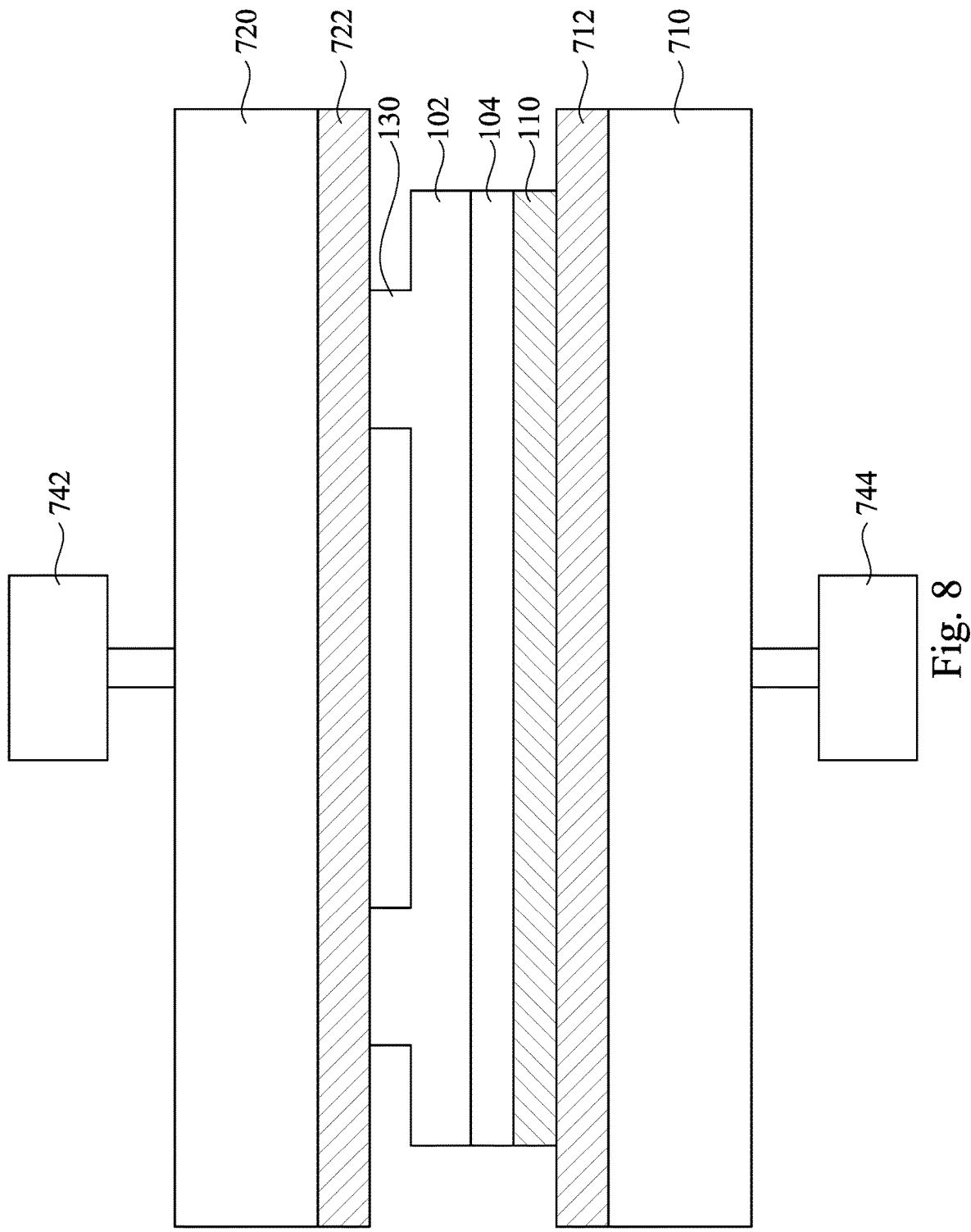

Next, please refer to FIGS. 7 and 8. FIG. 7 is a schematic cross-section view of a planarization method of a wafer with respect to a double-side polishing machine 700 according some embodiments of this disclosure, and FIG. 8 is a schematic view of a planarization method of a wafer during another planarization process based on a frame 705 in FIG. 7 according to some embodiments of this disclosure. A planarization process, such as a double-side planarization process, is performed to remove the protection layer 110 on the wafer 102 and the symmetrical pattern 130 in the backside of the wafer 102 by a double-side polishing machine 700.

As shown in FIG. 7, the double-side polishing machine 700 includes a lower fixing plate 710 in the wafer carrier, a lower grind pad 712 on a upper surface of the lower fixing plate 710 in the wafer carrier, an upper fixing plate 720 and an upper grind pad 722 on a lower surface of the upper fixing plate 720, a plurality of wafer carriers 730, a wafer-holding hole 732 for holding the wafer 102 in the wafer carrier 730, a lower driven apparatus 744 and an upper driven apparatus 742.

Specifically, the wafer 102 is firstly placed in the wafer-holding hole. Next, as shown in FIG. 8, the lower fixing plate 710 and the upper fixing plate 720 collectively clamp the wafer 102. Although the surface of the protection layer 110 contacts a surface of the lower grind pad 712 and the symmetrical pattern 130 contacts a surface of the upper grind pad 722 illustrated in FIG. 7, this disclosure is not limited thereto. In some embodiments, the surface of the protection layer 110 contacts the surface of the upper grind pad 722, and the symmetrical pattern 130 contacts the surface of the lower grind pad 712. Then, the lower fixing plate 710 and the upper fixing plate 720 are rotated by the lower driven apparatus 744 and the upper driven apparatus 742, respectively, so as to rotate the wafer carrier. At the same time, the protection layer 110 and the symmetrical pattern 130 are polished through contacting the lower grind pad 712 and upper grind pad 722.

In addition, a slurry (not shown) is applied to the surfaces the lower grind pad and upper grind pad by a slurry dispenser (not shown) during the double-side planarization process. In some embodiments, a removed thickness of the protection layer 110, a removed thickness of the symmetrical pattern 130 in the backside of the wafer 102, a planarity and flatness or combinations thereof, is controlled by adjusting a temperature of the wafer carrier, a flow rate of the slurry, contents in the slurry, a reaction time, a process pressure or combination thereof.

Figure 9:
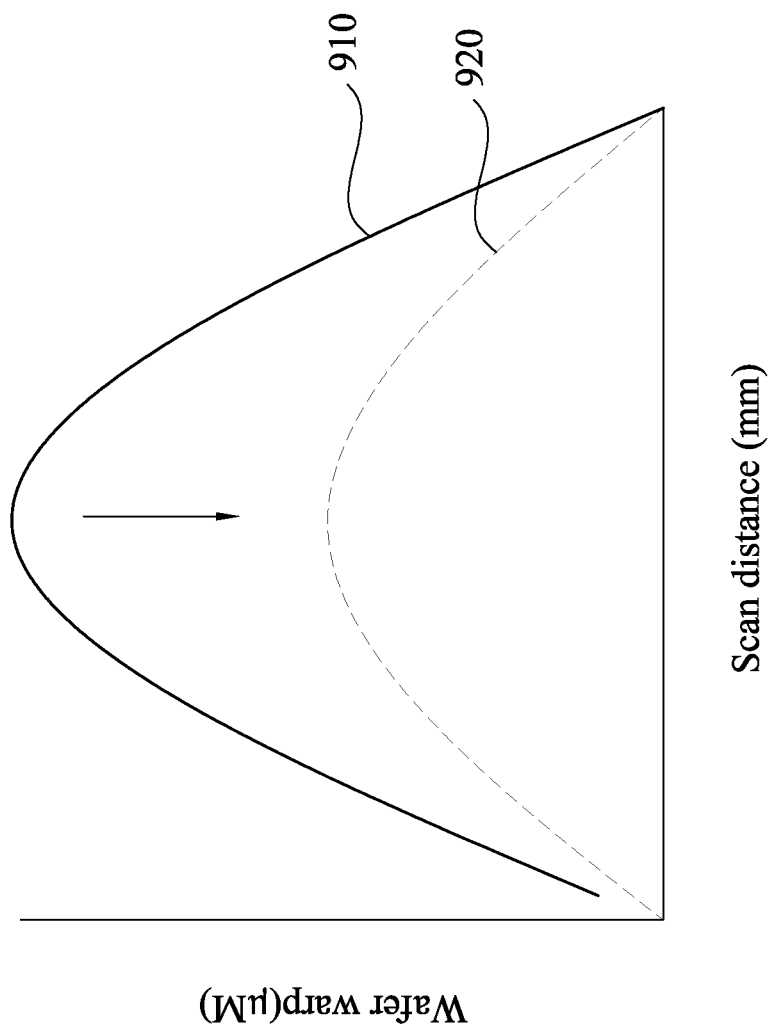
FIG. 9 is a comparison diagram of a wafer warp of a wafer not performing and performing a planarization process according to some embodiments of this disclosure.

Next, please refer to FIG. 9. FIG. 9 is a comparison diagram of a wafer warp of a wafer not performing and performing a planarization process according to some embodiments of this disclosure. A curve 910 represents a wafer warp of the wafer not performed through the planarization process provided by the embodiments of this disclosure, and a curve 920 represents a wafer warp of the wafer 102 performed through the planarization process provided by the embodiments of this disclosure. As shown in FIG. 9, compared to the curve 910, the curve 920 is decreased significantly. That is, the wafer warp of the wafer (such as the wafer 102 in FIGS. 5 and 6 or FIG. 8) performed through the planarization process is significantly improved.

As a result, the planarization method for the wafer provided by the embodiments of this disclosure is beneficial to control the planarity and the flatness of the wafer through forming the symmetrical pattern in the backside of the wafer. In addition, combined forming the symmetrical pattern with the planarization process, the topography of the backside of the wafer can be improved. As well, the vacuum value of the chuck can be improved. That is, the vacuum leakage can be decreased.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A planarization method of a wafer, comprising:
   providing a wafer with a semiconductor structure on a front surface of the wafer;
   forming a protection layer on the semiconductor structure of the wafer;
   forming a pattern mask on a back surface of the wafer to cover a first portion of the back surface and expose a second portion and a third portion of the back surface, wherein the pattern mask is a symmetrical shape;
   etching the second portion and the third portion of the wafer to form a symmetrical pattern in a backside of the wafer; and
   performing a planarization process to remove the protection layer on the front surface of the wafer, wherein performing the planarization process comprising:
      mounting the wafer on a polishing machine with a grind pad through sucking the symmetrical pattern in the backside of the wafer; and
      removing the protection layer on the semiconductor structure.

2. The method of claim 1, wherein performing the planarization process comprising:
   mounting the wafer on the polishing machine with the grind pad through sucking a surface of the semiconductor structure after removing the protection layer; and
   planarizing the backside of the wafer.

3. The method of claim 2, wherein performing the planarization process comprises:
   pressing the wafer against a surface of the grind pad and rotating the wafer; and
   providing a slurry on the surface of the grind pad.

4. The method of claim 1, wherein etching the second portion and the third portion of the wafer is performed through a wet etching process.

5. The method of claim 4, wherein the wet etching process comprises:
   putting the wafer with the pattern mask in an etching tank with an etchant, and the second portion and the third portion are removed through the wet etching process.

6. The method of claim 5, wherein the etchant comprises $HNO_{3\ (aq)}$, $H_2SO_{4\ (aq)}$, $HF_{(aq)}$ or combinations thereof.

7. The method of claim 5, wherein the protection layer formed on the semiconductor structure is resistant to the etchant.

8. The method of claim 7, wherein a portion of the wafer originally containing the symmetrical pattern and portions recessed after etching are coplanar after the planarization process.

9. The method of claim 1, wherein the pattern mask has a hollow and symmetrical pattern.

10. The method of claim 1, wherein an outer distance between an outer edge of the symmetrical pattern and an outer edge of the wafer is the same or different.

11. The method of claim 1, wherein the second portion is a portion from an edge of the wafer to an outer edge of the pattern mask, and the third portion is an exposed portion near to a center of the wafer.

12. A planarization method of a wafer, comprising:
   providing a wafer with a semiconductor structure on a front surface of the wafer;
   forming an oxide layer on the semiconductor structure of the wafer;
   forming a pattern mask on a back surface of the wafer to cover a portion of the back surface and expose an outward exposed portion and an inward exposed portion of the back surface, wherein the pattern mask is a symmetrical shape;

etching the outward exposed portion and the inward exposed portion of the wafer to form a symmetrical pattern in a backside of the wafer; and performing a planarization process to remove the oxide layer on the front surface of the wafer and the symmetrical pattern in the backside of the wafer, wherein performing the planarization process comprising:
  placing the wafer in a wafer-holding hole of a polishing machine;
  clamping the wafer by a lower fixing plate and an upper fixing plate, wherein the lower fixing plate comprises a lower grind pad on an upper surface of the lower fixing plate, and the upper fixing plate comprises an upper grind pad on an lower surface of the upper fixing plate; and
  rotating the lower fixing plate and the upper fixing plate to remove the oxide layer on the front surface of the wafer and the symmetrical pattern in the backside of the wafer.

13. The method of claim 12, wherein etching the outward exposed portion and the inward exposed portion is performed through a wet etching process.

14. The method of claim 13, wherein the wet etching process comprises:
  putting the wafer with the pattern mask in an etching tank with an etchant.

15. The method of claim 14, wherein an etching rate of the wet etching process is controlled by adjusting bubble positions, bubble flows, a rotate acceleration, a temperature of the etching tank, an acid content in the etchant, a pressure of the wet etching process or combinations thereof.

16. The method of claim 14, wherein the oxide layer formed on the semiconductor structure is resistant to the etchant to protect the semiconductor structure and the wafer from etching damage.

17. The method of claim 12, wherein a surface of the oxide layer contacts a surface of the upper grind pad, and the symmetrical pattern contacts a surface of the lower grind pad.

18. The method of claim 12, wherein a surface of the oxide layer contacts a surface of the lower grind pad, and the symmetrical pattern contacts a surface of the upper grind pad.

19. The method of claim 12, wherein a slurry is applied to a surface of the lower grind pad and a surface of the upper grind pad during the planarization process.

20. The method of claim 12, wherein an outer distance between an outer edge of the symmetrical pattern and an outer edge of the wafer is the same or different.

* * * * *